(12) United States Patent
Fronheiser et al.

(10) Patent No.: US 7,906,427 B2
(45) Date of Patent: Mar. 15, 2011

(54) DIMENSION PROFILING OF SIC DEVICES

(75) Inventors: Jody Alan Fronheiser, Selkirk, NY (US); Peter Micah Sandvik, Niskayuna, NY (US); Kevin Sean Matocha, Rexford, NY (US); Vinayak Tilak, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 37 days.

(21) Appl. No.: 12/251,341

(22) Filed: Oct. 14, 2008

(65) Prior Publication Data
US 2010/0093116 A1    Apr. 15, 2010

(51) Int. Cl.
*H01L 21/4763* (2006.01)

(52) U.S. Cl. ..................................... 438/622

(58) Field of Classification Search ............... None
See application file for complete search history.

(56) References Cited

U.S. PATENT DOCUMENTS

| | | | |
|---|---|---|---|
| 5,318,915 A | 6/1994 | Baliga et al. | |
| 5,322,802 A | 6/1994 | Baliga et al. | |
| 5,670,410 A | 9/1997 | Pan | |
| 5,705,406 A | 1/1998 | Rottner et al. | |
| 6,060,786 A | 5/2000 | Wang | |
| 6,281,025 B1 | 8/2001 | Ring et al. | |
| 6,313,482 B1 | 11/2001 | Baliga | |
| 6,419,754 B1 | 7/2002 | Choi et al. | |
| 6,641,471 B1 * | 11/2003 | Pinheiro et al. | 451/526 |
| 6,750,524 B2 | 6/2004 | Bose et al. | |
| 6,783,426 B2 | 8/2004 | Drown et al. | |
| 6,853,006 B2 | 2/2005 | Kataoka et al. | |
| 6,908,846 B2 * | 6/2005 | McMillin et al. | 438/622 |
| 7,042,046 B2 | 5/2006 | Onishi et al. | |
| 7,476,594 B2 * | 1/2009 | Suvorov | 438/407 |
| 2004/0007325 A1 * | 1/2004 | Pan et al. | 156/345.1 |
| 2006/0024928 A1 * | 2/2006 | Seebauer et al. | 438/514 |
| 2006/0097267 A1 | 5/2006 | Kumar et al. | |
| 2006/0131644 A1 | 6/2006 | Saito et al. | |

FOREIGN PATENT DOCUMENTS

| | | |
|---|---|---|
| EP | 0627761 B1 | 11/2001 |
| WO | 2004038788 A2 | 5/2004 |

OTHER PUBLICATIONS

"High Voltage Thin Layer Devices (Resurf Devices)" Appels, JA; Vaes, H.M.J.; Phillips Research Laboratories, Eindhoven, The Netherlands; 1979 IEEE; pp. 238-244.

Proceedings of 1998 International Symposium on Power Semiconductor Devices & ICs, Kyoto, "Simulated Superior Performances of Semiconductor Superjunction Devices" Fujihira, Tatsuhiko; Miyasaka, Yasushi; pp. 423-426.

1999 IEEE "COOLMOS—A new milestone in high voltage Power MOS" Lorenz, L; Deboy, G.; Knapp, A.; Marz, M., pp. 3-10.

(Continued)

*Primary Examiner* — Charles D Garber
*Assistant Examiner* — Andre' C Stevenson
(74) *Attorney, Agent, or Firm* — Scott J. Asmus

(57) ABSTRACT

There is provided a method for dimension profiling of a semiconductor device. The method involves incorporating a feature comprising a detectable element into the device, and thereafter detecting the detectable element to determine a dimension of the feature. This information can be used for the determination of a dimension of buried channels, and also for end-point detection of CMP processes.

16 Claims, 11 Drawing Sheets

OTHER PUBLICATIONS

Journal of Electronic Materials, vol. 31, No. 5, 2002, "Stacking-Fault Formation and Propagation in 4H-SiC PiN Diodes" Stahlbush, R.E.; Fatemi, M.; Fedison, J.B.; Arthur, S.D.; Rowland, L.B., Wang, S., pp. 370-375.

Institute of Physics Publishing, Semiconductor Science and Technology, vol. 17, Aug. 9, 2002, "Carrier mobility model for simulation of SiC-based electronics devices." Mnatsakanov, T. T.; Levinshtein, M.E.; Pomortseva, L.I.; Yurkov, S.N., pp. 974-977.

IEEE Transactions on Electron Devices, vol. 50, No. 3, Mar. 2003, "High temperature SiC Trench Gate p-IGBTs" Singh, Ranbir; Ryu, Sei-Hyung; Capell, D. Draig; Palmour, John W., pp. 774-784.

IEEE Transactions on Electron Devices, vol. 51, No. 3, Mar. 2004, "On the Specific On-Resistance of High-Voltage and Power Devices" Singg, Rene P., pp. 492-499.

Proceedings of the 17th International Symposium on Power Semiconductor Devices & ICs, May 23-26, 2005, Santa Barbara, CA, "Evolution of the 1600 V. 20 A, SiC Bipolar Junction Transistors" Agarwal, Anant K; Krishnaswami, Sumi; Richmond, James; Capell, Craig; Ryu, Sei_Hyung; Palmour, John W.; Balachandran, Santosh; Chow, T.Paul; Bayne, Stephen; Geil, Bruce; Scozzie, Charles; Jones, Kenneth A.; pp. 1-3, 162.

Laursen, Thomas; Grief, Malcolm; "Multiprobe end-point detection for precisions control of the copper CMP process,", Materials Research Society Symposium Proceedings, v 61, 2001, pp. M7.6.1-M7.6.6.

Seo, Yong-Jin; Lee, Woo-Sun; Park, Jin-Seong; Kim, Sang-Yong; "Motor current based real time end point detection of shallow trench isolation chemical mechanical polishing process using high selectivity slurry", Japanese Journal of Applied Physics, Part 1: Regular Papers and Short Notes and Review Papers, v. 42, n. 10, Oct. 2003, pp. 6396-6399.

Wang, Sim Kit; Butler, David Lee; "A methodology to reduce the wafer to wafer thickness variation in Chemical Mechanical Planarization (CMP)", Proceedings of the World Tribology Congress III, 2005, pp. 507-508.

Saddow et al., "Advances in Selective Doping of SiC Via Ion Implantation", in Advances in Silicon Carbide Processing and Applications, 2004, pp. 109-114 and 128-140, Artech House, Inc., ISBN 1-58053-740-5.

* cited by examiner

DIMENSION PROFILING OF SIC DEVICES

BACKGROUND

Silicon (Si) is the most widely used semiconductor material, and has been for many years. Due to intense commercial interest and resulting research and development, Si device technology has reached an advanced level, and in fact, many believe that silicon power deices are approaching the theoretical maximum power limit predicted for this material. Further refinements in this material are not likely to yield substantial improvements in performance, and as a result, development efforts have shifted in focus to the development of other wide band gap semiconductors as replacements for silicon.

Silicon carbide (SiC) has many desirable properties for high voltage, high frequency and high temperature applications. More particularly, SiC has a large critical electric field (10 times higher than that of Si), a large bandgap (3 times that of Si), a large thermal conductivity (4 times that of Si) and a large electron saturation velocity (twice that of Si). These properties support the theory that SiC will excel over conventional power device applications, such as MOSFETs, SiC n-channel enhancement mode MOSFETs, and SiC diodes such as a merged PIN Schottky (MPS) or a junction barrier Schottky diode(JBS).

Although SiC based semiconductor devices thus provide many advantageous properties as compared to Si devices, the material properties of SiC can make it more difficult to process than Si. As a result, and generally speaking, those of ordinary skill in the art of semiconductor processing would not expect processes useful in the fabrication of an Si device to be useful in the fabrication of an SiC device, and vice versa. As but one example, SiC is more chemically inert than Si and so any manufacturing processes relying on the reactivity of the substrate, such as etching or chemical mechanical polishing or planarization (CMP), will necessarily be different for each material.

One example of devices advantageously based upon SiC substrates are the metal oxide semiconductor field effect transistors (MOSFETS). SiC MOSFETS may typically be processed with ion implantation and/or epitaxial growth for the deposition of features on the substrate. CMP may subsequently be utilized to planarize the 'bumpy' surface that can result from ion implantation, or to remove any unwanted epitaxial grown material from designated areas in order to leave the desired feature on the substrate. With respect to the latter, CMP is preferable to either gas or liquid phase etching as these methods, relying only on chemical removal, may not provide commercially acceptable removal when applied to the relatively inert SiC. Either vertical or lateral MOSFETS may also typically comprise buried channels, which are desirably left undisturbed by any CMP of the device surface.

Determining the endpoint of a CMP polish is challenging with any kind of material, and whatever the material, additional challenges may be presented if the surface being polished is non-planar and/or comprises buried channels. In any case, removing too much or too little material can render the resulting device non-functional. Typically, the endpoint of a CMP polish is determined by back calculating an appropriate etch time given the known etch rate of the polish protocol and the material being polished. Once the calculated time has been reached, the device is removed from the process, cleaned and the thickness of the remaining layer measured, typically via optical imaging.

Unfortunately, these methods may provide less than optimal results. Firstly, the etch rate may actually fluctuate during the process due to even slight fluctuations in any of a number of conditions, in which case, the calculated time will be incorrect. Additionally, the use of etch rate to calculate a process time may be suboptimal in applications where a non-planar surface is desirably being treated. Secondly, even though optical measurements are typically very accurate, some optical measurement techniques require destruction of the sample and may not be capable of accurately measuring small changes.

It would thus be desirable to provide improved methods for dimension profiling of SiC devices. Any such method would desirably not detrimentally impact either the process, e.g., via the addition of time, cost or safety concerns, or the device, e.g., by the incorporation of undesirable components for use in detection that may detrimentally affect device performance.

BRIEF DESCRIPTION

There is presently provided a method for the dimension profiling of a semiconductor device based upon a silicon carbide substrate including incorporating at least one feature comprising a detectable element into the device and measuring the dimension of the feature. In one embodiment, the feature comprises a buried channel. In another, the feature comprises one or more layers of the device.

In a further embodiment, a method is provided for processing a SiC MOSFET. More particularly, the method comprises incorporating at least one feature comprising a detectable element in the SiC MOSFET. Dimension profiling is conducted utilizing detection of the element, and the dimension profiling utilized in at least one step in the further processing of the SiC MOSFET.

In an additional embodiment, a method is provided for processing a SiC diode. More particularly, the method comprises incorporating at least one feature comprising a detectable element in the SiC diode. Dimension profiling is conducted utilizing detection of the element, and the dimension profiling utilized in at least one step in the further processing of the SiC diode.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
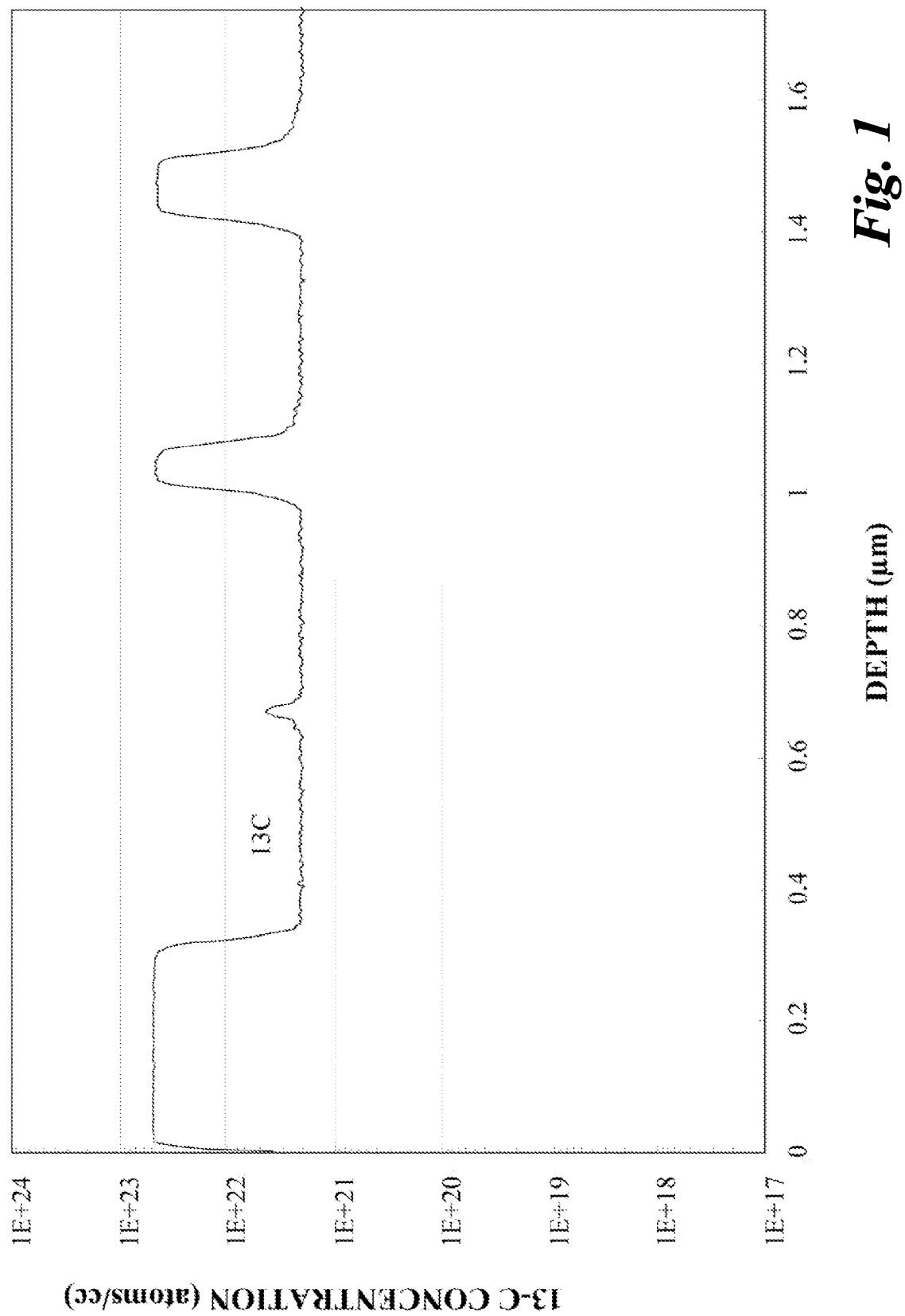
FIG. 1 is a SIMS profile of carbon 13 (C13)

Unless defined otherwise, technical and scientific terms used herein have the same meaning as is commonly understood by one of skill in the art to which this invention belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced item, and the terms "front", "back", "bottom", and/or "top", unless otherwise noted, are merely used for convenience of description, and are not limited to any one position or spatial orientation. If ranges are disclosed, the endpoints of all ranges directed to the same component or property are inclusive and independently combinable (e.g., ranges of "up to about 25 wt. %, or, more specifically, about 5 wt. % to about 20 wt. %," is inclusive of the endpoints and all intermediate values of the ranges of "about 5 wt. % to about 25 wt. %," etc.). The modifier "about" used in connection with a quantity is inclusive of the stated value and has the meaning dictated by the context (e.g., includes the degree of error associated with measurement of the particular quantity).

The present embodiments relate generally to dimension profiling of silicon carbide semiconductor devices, as may be useful for the detection of buried channels and/or a dimension thereof and for end-point detection of chemical mechanical polishing of such SiC semiconductor devices. More specifically, a detectable element is incorporated into a feature of the device, and detection of the same is utilized to gauge a dimension of the feature, detect buried channels or to determine an endpoint of a CMP process.

As used herein, "dimension profiling" is meant to indicate the measurement of at least one dimension, e.g., length, width, height, of at least one feature of the device, as is facilitated by the incorporation of a detectable element therein. In certain embodiments, at least two dimensions, or two of the same dimension measurement, may be utilized. For example, two measurements, i.e., one of height (or depth, as the case may be) to the top of the feature and the other to the bottom of the feature, may be utilized to determine thickness of the feature. Multiple measurements may be utilized to determine one property of a feature, as is the case when thickness is being assessed, or, may be utilized to provide a 2D or even a 3D map of the device. That is, although the multiple measurements may be averaged, in particularly advantageous embodiments, the multiple measurements can be utilized to provide a 2D or 3D information about the feature. It is to be understood that although the term 'measure' and variants thereof is used throughout this specification, that this includes either manual measurement, or measurements conducted by appropriate analytical equipment and data transferred to an appropriate data image apparatus where it thereafter may be assessed by a trained technician.

The detectable element may be any element detectable by any means, that does not interfere with the performance of the completed device. Desirably, the detectable element will be an isotope, and more desirably, an isotope of an element already present in the device, so fabrication of the feature comprising the isotope may be readily and easily incorporated into the device. For example, the elements aluminum, nitrogen, boron, phosphorus, gallium, oxygen, vanadium, titanium, germanium, silicon, carbon may commonly be utilized in the production of silicon carbide semiconductor devices, and isotopes of these and combinations of the same may advantageously be utilized as the detectable element according to certain embodiments. Of these, silicon and carbon are the most widely used and/or readily available, and so, may advantageously used in some embodiments. There are many isotopes of both silicon and carbon, but those that are readily commercially available are conveniently utilized, i.e., carbon 12, carbon 13 or carbon 14, silicon 28, silicon 29 or silicon 30. In some embodiments, the detectable element may be carbon 13, which advantageously is readily commercially available and may be more cost effective than many other isotopes.

The desired detectable element may be incorporated into the desired feature via any known, suitable method. Advantageously, and in those embodiments of the invention wherein the detectable element comprises an isotope of an element already present in the device, incorporation of the detectable element may be accomplished via the same processing technique utilized to deposit the feature comprising already present element. In many SiC device processing techniques, features may typically be deposited or otherwise added via epitaxial growth or ion implantation, and these techniques are suitable for the incorporation of the feature comprising the detectable element.

More particularly, a feature comprising the detectable element may be incorporated into the device via epitaxial growth or ion implantation of the feature by simply replacing the already present element source in the epitaxial growth or ion implantation process with the detectable element. That is, if a layer comprising carbon 13 is desirably epitaxially grown over an epitaxially grown layer comprising carbon 12, the carbon 12 source, typically a carrier gas such as propane comprising carbon 12, may simply be replaced with a corresponding carbon 13 source, i.e., propane gas comprising carbon 13.

The detectable element may be incorporated into any desired feature, or multiple features, of the device. As one example, the detectable element may be incorporated into one or more layers of the device. In this embodiment of the invention, detection of the layer can provide endpoint detection of, e.g., a CMP process, so that increased throughputs and reductions in wasted material can be seen. For substrates with too little removal, CMP can be reinitiated to achieve the desired removal, and substrates that have had too much material removed can be discarded prior to the completion of formation of the device, thereby saving time and material cost.

More particularly, in these embodiments of the invention, the dimension profiling can be utilized for in-line end-point detection in a CMP process. In these embodiments, the method would further comprise determining a processing time based at least upon the measured depth of the feature and conducting the CMP process for the determined time. In conventional CMP processes, end-point detection may typically be based on estimated etch rate. Utilizing an actual parameter rather than an estimated, theoretical parameter, may typically provide a more accurate end-point, and thus provide a CMP process with less waste, not only of the particular device that may have been overprocessed, but also of further processing steps that may otherwise be conducted a defective substrate, only to provide an inoperative device. If desired, more than one measurement may be utilized, e.g., so that a 2D or 3D image of the device is provided, and the end-point detection based upon such multiple measurements is expected to be even more accurate. Or, one or more measurements of one or more dimensions of one or more features may be combined with an estimated etch rate to provide further improvements to the end-point detection.

Also, multiple layers comprising the detectable element may be utilized to achieve more accurate thickness and removal profiles. One application of this aspect of the invention would include the use of multiple layers of varying thickness and/or comprising varying concentrations of the detectable element to assess a dimension, e.g., depth, width, thickness and the like, across the wafer for uniformity and for amount of material removed during processing.

In those embodiments of the invention wherein the feature comprises one or more layers, the layers may be of any thickness that does not interfere with the electrical properties of the overall device, but yet provides an amount of the detectable element that is readily detectable with the chosen detection technique. Suitable thickness will thus vary depending on the detectable element utilized, and so generally speaking, suitable thicknesses of layers comprising the detectable element may range from at least about 10 nm to about 100 nm, or from about 100 nm to about 20000 nm, inclusive of all subranges in between.

One other example of a feature into which the detectable element may advantageously be incorporated would be a buried channel. In this embodiment, the present method allows for the accurate determination of the thickness of the layer covering the buried channel and/or of the thickness of the buried channel itself.

The feature incorporating the detectable element may be deposited on the substrate by any known appropriate semiconductor processing technique. Advantageously, in those embodiments wherein the detectable element comprises an isotope of an element already present in the device, the detectable element may simply be incorporated into the desired processing technique in the same fashion as the element already present in the device. For example, in those embodiments where carbon 13 is the isotope and the feature is a layer, the feature may be deposited via epitaxial growth by exposing the substrate to a gas or vapor comprising carbon 13 instead of carbon 12, utilized in other layers of the device. Propane is typically used as a carrier gas for the epitaxial growth of carbon 12 features or layers, and propane comprising carbon 13 is readily commercially available.

The detectable element may be detected by any suitable in-line detection technique. Desirably, the detection technique will be capable of detecting the element in a substantially non-destructive fashion so that once the desired dimension profiling has been conducted, the substrate may be further processed to provide an operable semiconductor device. Of course, many measurement techniques that do not require destruction of the sample to conduct the measurement, may result in damage to that portion of the device that is tested, either by the preparation of the device or portion of the device for the measurement, or by the analysis itself, and if any such damage limited so that the overall device is still operable, the measurement technique is considered "substantially nondestructive", as that phrase is used herein. Substantially nondestructive detection techniques include, but are not limited to, Rutherford backscattering (RBS), Nuclear reaction profiling (NRP), medium ion energy profiling, and secondary ion mass spectroscopy (SIMS).

In certain embodiments of the invention, the substrate subjected to testing can be a dummy wafer, and then the presumption(s) applied that a batch polish process will yield the same removal from wafer to wafer. In these quality/process control applications, any measurement technique, whether destructive or substantially non-destructive, may be utilized.

In those embodiments of the invention wherein the detectable element comprises carbon 13, SIMS (secondary ion mass spectroscopy) may advantageously be utilized as the detection technique. SIMS provides the advantage of being substantially nondestructive, so that the device so tested may advantageously be further processed to provide a complete device, if desired, thereby reducing or eliminating cost that may be associated with destructive measurement techniques.

SIMS may also advantageously be used in those embodiments of the invention wherein the element being tested comprises an isotope of e.g., carbon, silicon, etc. Isotopes of carbon and silicon in particular may advantageously be utilized in the methods of the present invention, since their incorporation into features of the device is not likely to result in a degradation of the performance of the device. Yet, the ubiquitous nature of carbon renders them difficult to measure with useful precision with many measurement techniques and extremely difficult to measure in in-situ processing environments. SIMS, typically conducted in a substantially contaminant free, in line environment under vacuum, can measure such elements more accurately, and thus, renders their use in the present devices more practical and useful than if measured via other measuring techniques, particularly in-situ measuring techniques. A SIMS profile of C13 is shown in FIG. 1, wherein the x-axis is depth of the C13 into the SiC substrate and the y-axis is the concentration of C13.

Figure 2:
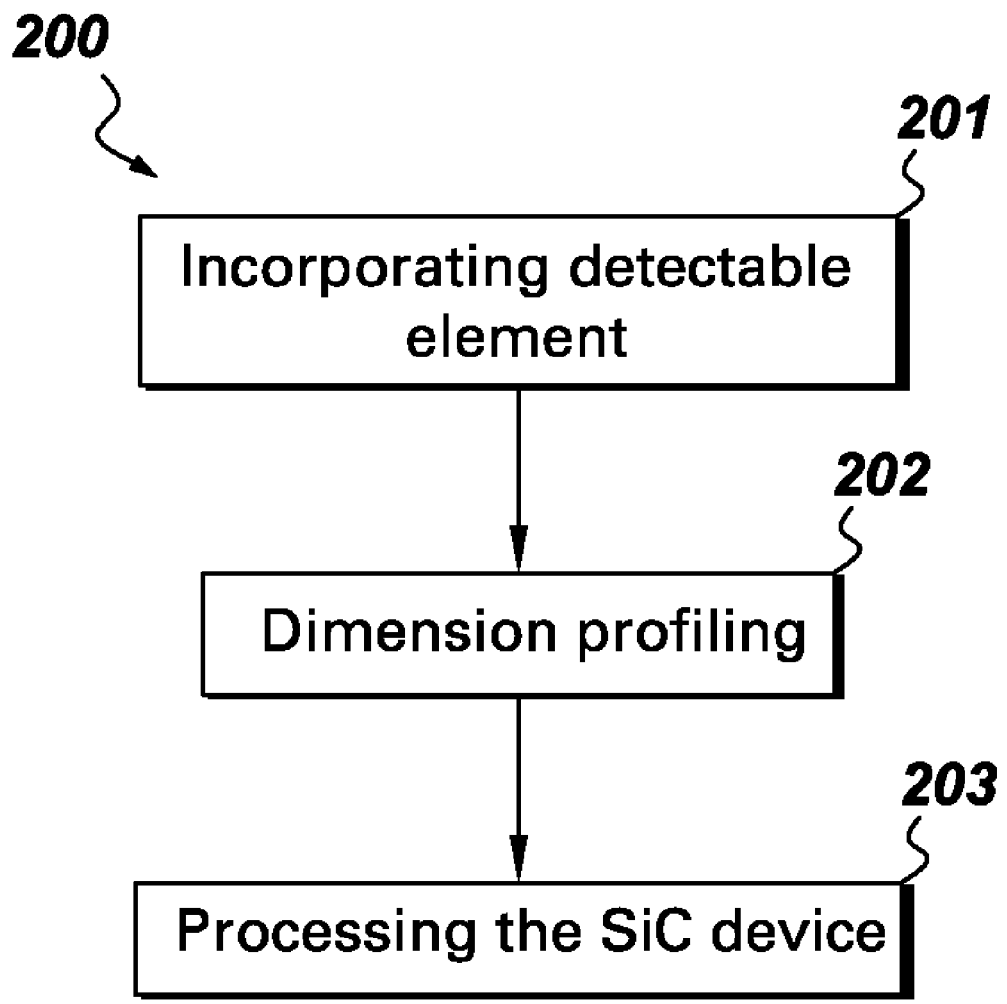
FIG. 2 is a flow-chart schematically illustrating one embodiment of the present method.

Certain embodiments of the present invention may be better understood with reference to FIG. 2. In FIG. 2, a flow chart schematically illustrating the present method 200, shows the incorporation of at least one detectable element into a feature of a SiC device in a first step 201. The detectable element may be incorporated into, e.g., a P-layer, an N-layer, a buried channel, etc., or may be provided as a separate layer to be provided between the desired layers of the device. The detectable element may be any detectable element, and desirably comprises an element detectable by substantially non-destructive testing methods and will not substantially interfere with the performance of the completed device. Examples of useful detectable elements include, but are not limited to, isotopes of elements otherwise desirably present in the completed device, e.g., aluminum, nitrogen, boron, phosphorus, gallium, oxygen, vanadium, titanium, germanium, silicon, carbon or combinations of these, and isotopes of carbon and silicon in particular are utilized in certain embodiments of the invention.

At step 202, dimension profiling of the feature is conducted via detection of the element. The dimension desirably profiled, or measured, may depend upon the feature into which the detectable element is incorporated, and may be, e.g., width, depth, thickness, etc. Advantageously, in certain embodiments, the profiling may be conducted with a substantially nondestructive testing technique, and SIMS analysis may be particularly useful in certain embodiments of the present method. At step 203, the SiC device having been so profiled, may be further processed to provide the desired completed device. For example, the SiC substrate may be processed to provide, a SiC MOSFET.

Figure 3A:
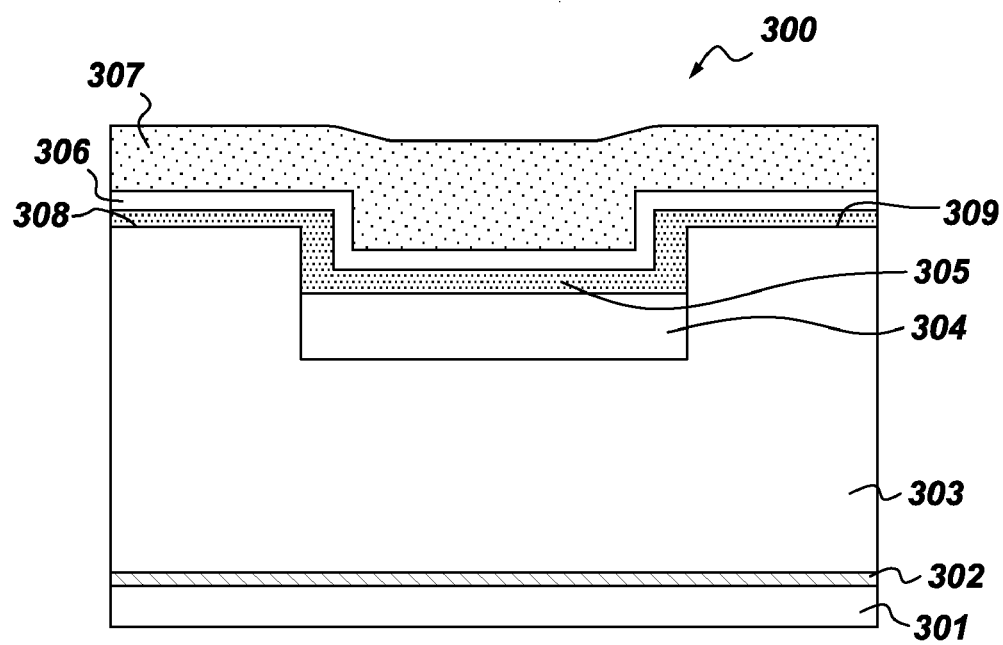
FIG. 3A is a cross sectional view of a semiconductor device incorporating a feature comprising a detectable element according to one embodiment of the invention.

Referring now to FIG. 3A, there is illustrated one example of a semiconductor device incorporating the principles described herein. More specifically, FIG. 3A shows device 300, comprising N+ substrate layer 301, N+ buffer layer 302, N-Drift layer 303, P+ implant 304, contiguous layer 305 comprising the detectable element, e.g., C13, P-type channel 306 and N+ contact layer 307. According to one aspect, a thin target layer 305 of about 0.2 micron is grown prior to the P-well 306 and N+ layers 307 in the refill process. The target layer 305 in one aspect so that it does not change the electrical properties of the device. The target layer in a further aspect is lightly doped.

Figure 3B:
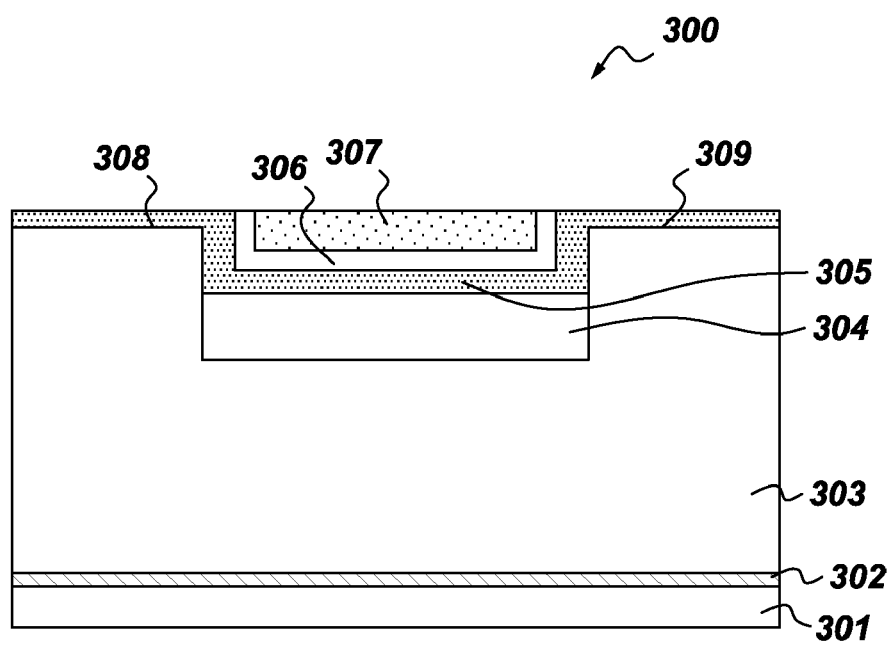
FIG. 3B is a cross sectional view of the device shown in FIG. 3A after utilizing detection of the detectable element, e.g., C13, in the feature for dimension profiling, and applying the information obtained to conduct CMP on the device.

In one method, CMP would be utilized to planarize the device, i.e., to remove N+ contact layer 307 and P-type 306 until target layer 305 is reached. More particularly, SIMS analysis would be conducted to determine the approximate depth of target layer 305, and the CMP polish carried out for a time expected to reach target layer 305 (or remove target layer 305 from surfaces 308 and 309) based upon the measured depth and etch rate, and SIMS analysis again performed to confirm that the desired material had been removed. FIG. 3B shows device 300 after the CMP process.

As mentioned above, device 300 could also be a dummy wafer, and the presumption applied that other devices within the batch will undergo the same material removal via a batch CMP process. At a minimum, using device 300 as a dummy should ensure that the majority of devices within the batch will substantially retain their electrical properties post-CMP. Since the properties are similar, the dummy wafer or TEG region provides insight as to the amount of etching required to reach the target layer 305 such that the processing can be automated or semi-automated.

Figure 3C:
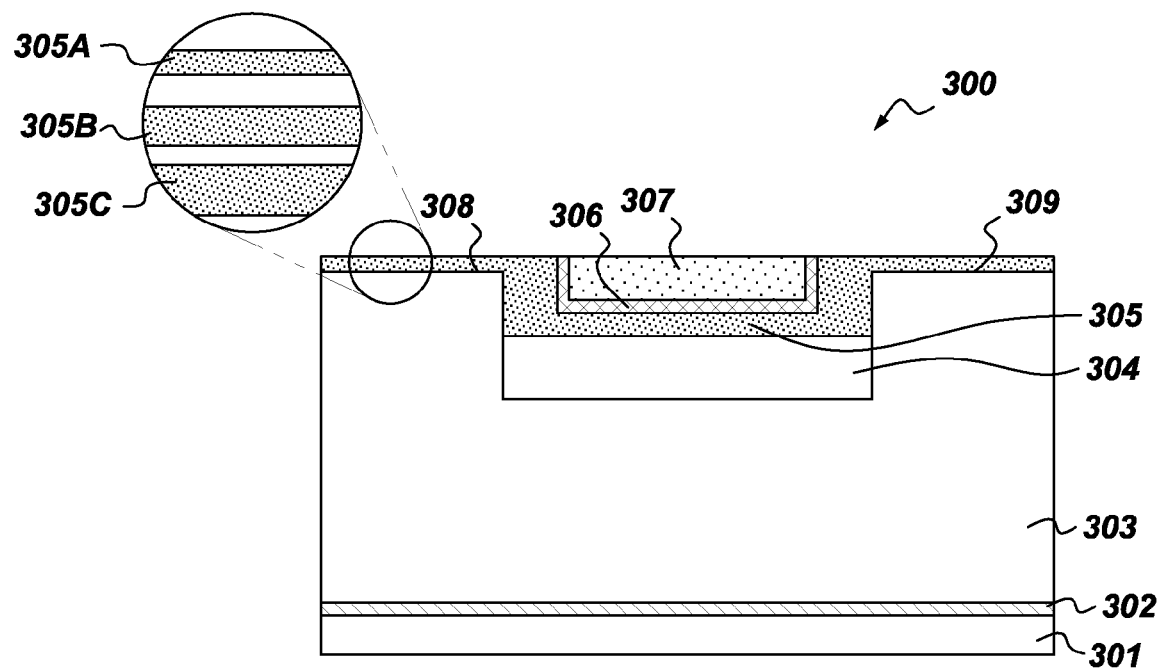
FIG. 3C is a cross sectional view of the device shown in FIG. 3A, wherein the feature comprises multiple layers further comprising different thicknesses and/or concentrations of the detectable element, e.g., C13.

FIG. 3C shows an additional embodiment wherein layer 305 may comprise multiple layers, 305A, 305B and 305C, of different thickness and/or concentrations of C13. In this embodiment, layers 305A, 305B and 305C may act as a 'key' and be used to determine gross polish error or to establish polishing rates and/or uniformity across one or more dummy wafers and the parameters determined utilized for runs with live wafers. More particularly, the different thickness and/or concentrations of C13 in the multi-layer "key" are created in a controlled fashion such that dimension profiling of each layer may allow even more accurate determinations of the amount of removed material with respect to surfaces 308 and 309. That is, as material is removed, detection of either the presence or lack thereof of C13, or the presence of C13 in combination with the thickness of the layer comprising C13 or concentration of C13 within the layer, can be used to determine the depth at least one of the multiple layers, desirably at least two, so that the amount of material removed may be determined with even greater accuracy.

Figure 4:
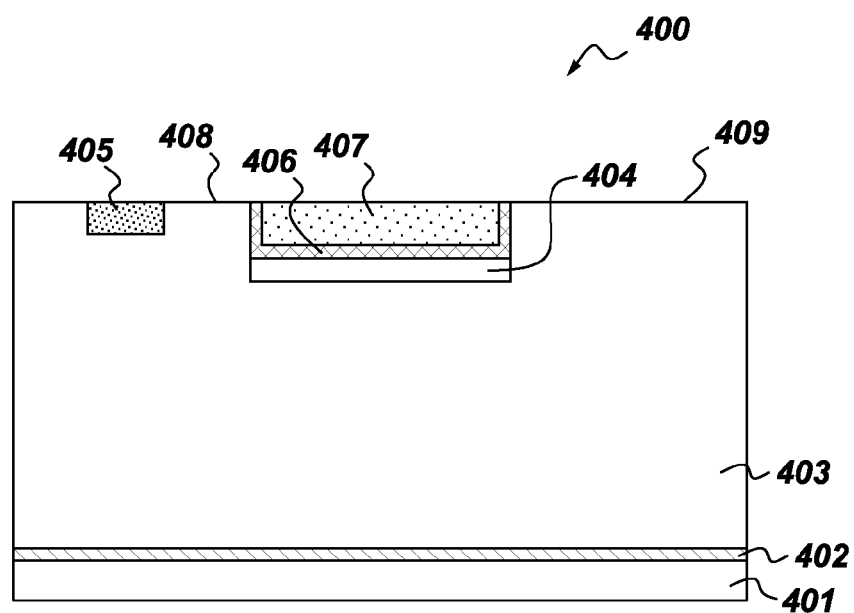
FIG. 4 is a cross section view of a semiconductor device incorporating a feature comprising a detectable element, wherein the feature comprises a region, according to another embodiment of the invention.

FIG. 4 shows an alternative embodiment, wherein device 400 comprises feature 405, wherein feature 405 comprises a region comprising the desired detectable element, e.g., C13, implanted within, and level with the surface of N-drift layer 403. More specifically, device 400 comprises N+ substrate layer 401, N+ buffer layer 402, N-Drift layer 403, P+ implant 404, layer 405 comprising the detectable element, e.g., C13, P-layer 406 and N+ contact layer 407. Device 400 is shown after a CMP process—prior to CMP, P-layer 406 and N+ contact layer 407 would extend over layer 405 as it extends over surfaces 408 and 409, similar to layers 306 and 307 in FIG. 3A.

In this embodiment of the present method, CMP would be utilized to planarize the device, i.e., to remove N+ contact 407 and P-type channel 406 from surfaces 408 and 409. More particularly, SIMS analysis would be conducted to determine the approximate depth of region 405, and the CMP polish carried out for a time expected to remove region 405 from surfaces 408 and 409 based upon the measured depth and etch rate, and SIMS analysis again performed to confirm that the desired material had been removed.

Figure 5A:
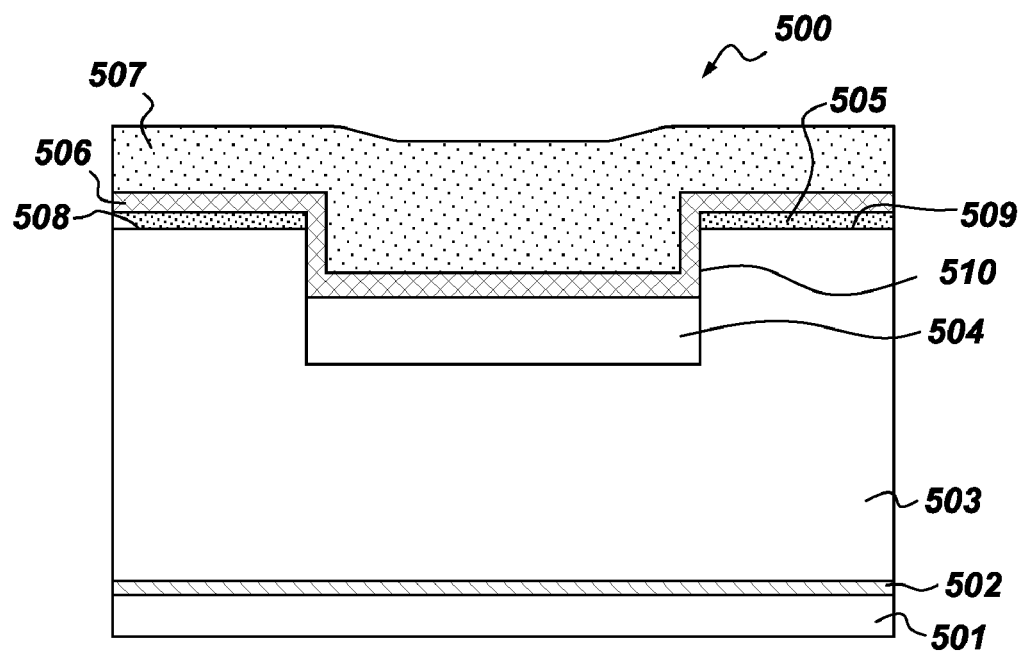
FIG. 5A is a cross sectional view of a semiconductor device incorporating a feature comprising a detectable element, wherein the feature comprises a discontinuous layer, according to a further embodiment of the invention.

FIG. 5A shows yet another embodiment, wherein device 500 comprises discontinuous target layer 505. More specifically, device 500 comprises N+ substrate layer 501, N+ buffer layer 502, N-drift layer 503, P+ implant 504, discontinuous target layer 505 comprising the detectable element, e.g., C13, P-well 506 and N+ contact layer 507. In this embodiment of the invention, target layer 505 does not extend through channel 510, but rather only over surfaces 508 and 509 of N-drift layer 503.

Figure 5B:
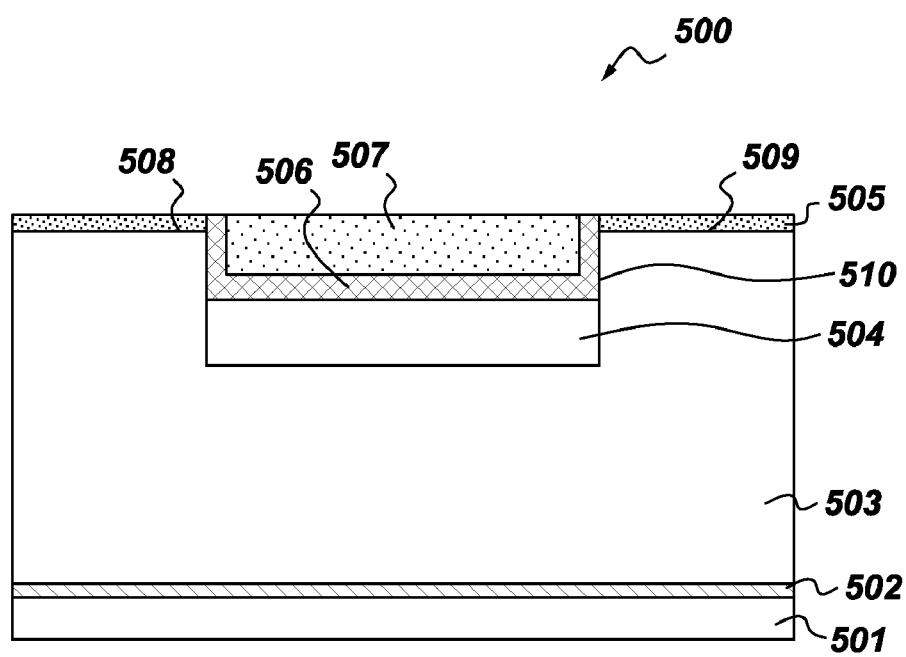
FIG. 5B is a cross sectional view of the device shown in FIG. 5A after utilizing detection of the detectable element, e.g., C13, in the feature for dimension profiling, and applying the information obtained to conduct CMP on the device.

In this embodiment of the present method, CMP would be utilized to planarize the device, i.e., to remove N+ contact layer 507 and P-layer 506 until layer 505 is reached. Alternatively, CMP could be conducted until the entirety of layer 505 is removed (not shown). More particularly, SIMS analysis would be conducted to determine the approximate depth of layer 505, and the CMP polish carried out for a time expected to reach layer 505 (or remove layer 505 from surfaces 508 and 509) based upon the measured depth and etch rate, and SIMS analysis again performed to confirm that the desired material had been removed. FIG. 5B shows device 500 after the CMP process.

Figure 5C:
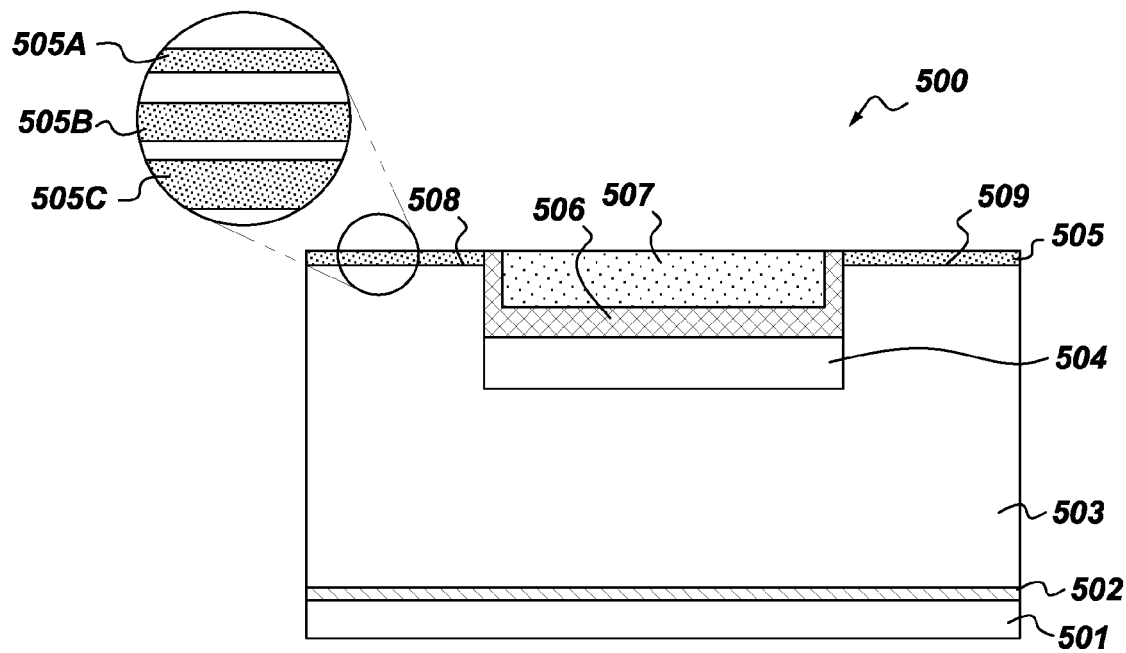
FIG. 5C is a cross sectional view of the device shown in FIG. 5A, wherein the region comprises multiple layers further comprising different thicknesses and/or concentrations of the detectable element, e.g., C13.

FIG. 5C shows an additional embodiment of the invention wherein discontinuous layer 505 may comprise multiple layers, 505A, 505B and 505C, of different thickness and/or concentration of C13. In this embodiment of the invention, layers 505A, 505B and 505C may act as a 'key' and be used to determine gross polish error or to establish polishing rates and/or uniformity across one or more dummy wafers and the parameters determined utilized for runs with live wafers.

Figure 6A:
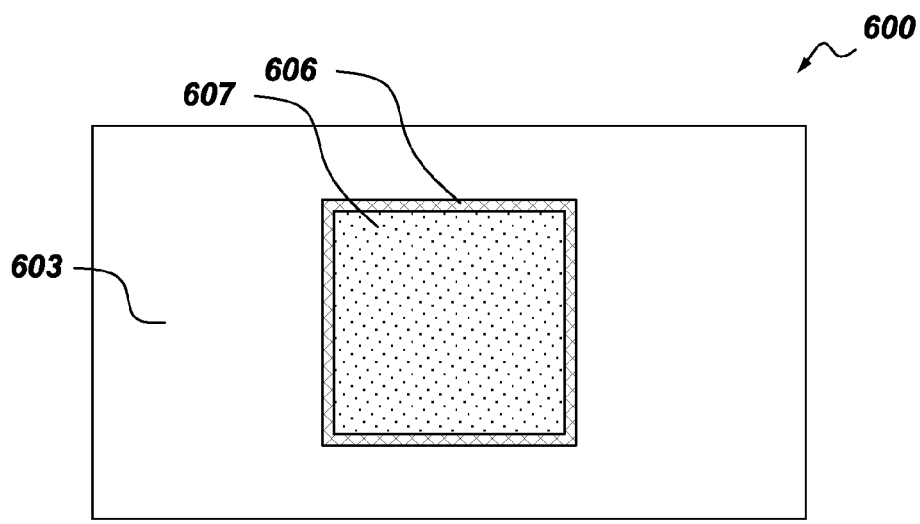
FIG. 6A is a top down view of a semiconductor device incorporating a feature comprising a detectable element, wherein the feature comprises a MOSFET channel, according to a further embodiment of the invention.
Figure 6B:
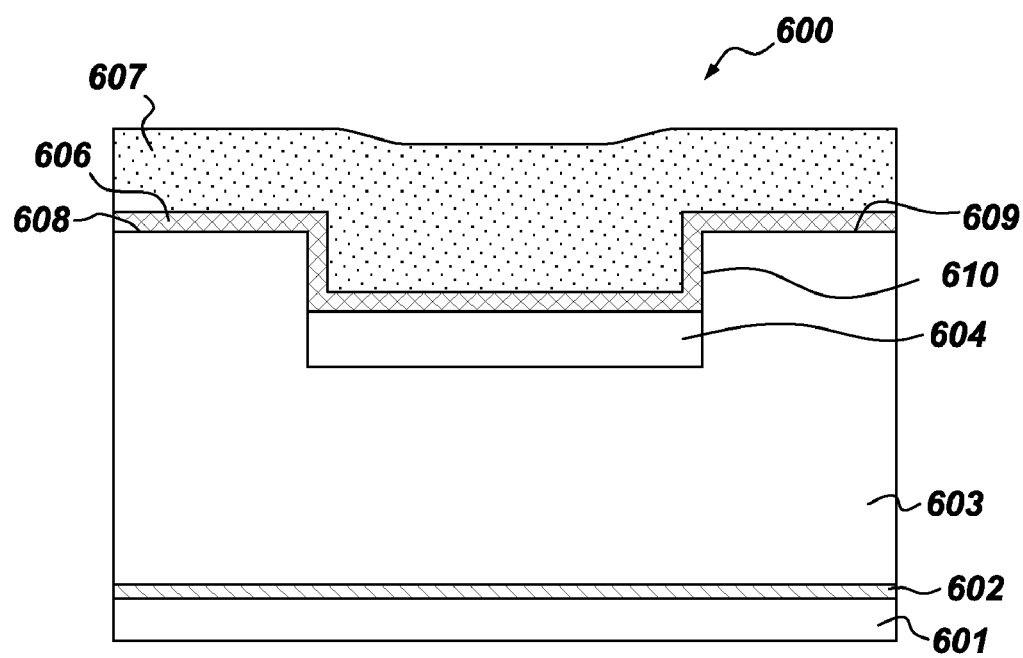
FIG. 6B is a cross sectional view of the semiconductor device shown in FIG. 6A, prior to CMP processing.

FIG. 6A shows a further embodiment of the invention wherein the detectable element is incorporated into the P-type channel 606 of a semiconductor device, i.e., the feature in this embodiment of the invention is the P-MOSFET channel. Device 600 comprises N-drift layer 603, P-layer 606 and N+ contact layer 607. A cross-sectional view of device 600, prior to CMP, is shown in FIG. 6B.

Figure 6C:
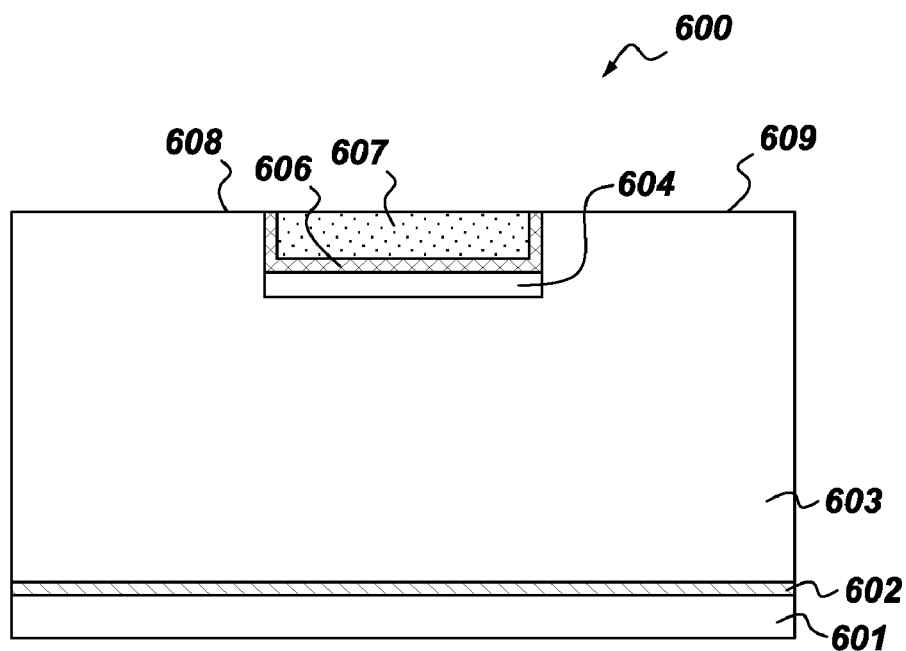
FIG. 6C is a cross sectional view of the semiconductor device shown in FIG. 6A.

In this embodiment of the invention, the P-layer may be epitaxially grown utilizing C13 in the carrier gas, usually propane, to provide the detectable element within the feature/P-well 606. SIMS analysis may be utilized for surface analysis of device 600, and may provide information about channel width and/or a CMP endpoint. In such embodiments, and when performing SIMS analysis generally in the areas of surfaces 608 or 609 an absence of C13 would indicate that polishing has removed enough material. If C13 is detected, further dimension profiling could be carried out to determine more much more material needed to be removed, and CMP conducted accordingly. A cross-sectional view of device 600, after CMP, is shown in FIG. 6C.

Figure 6D:
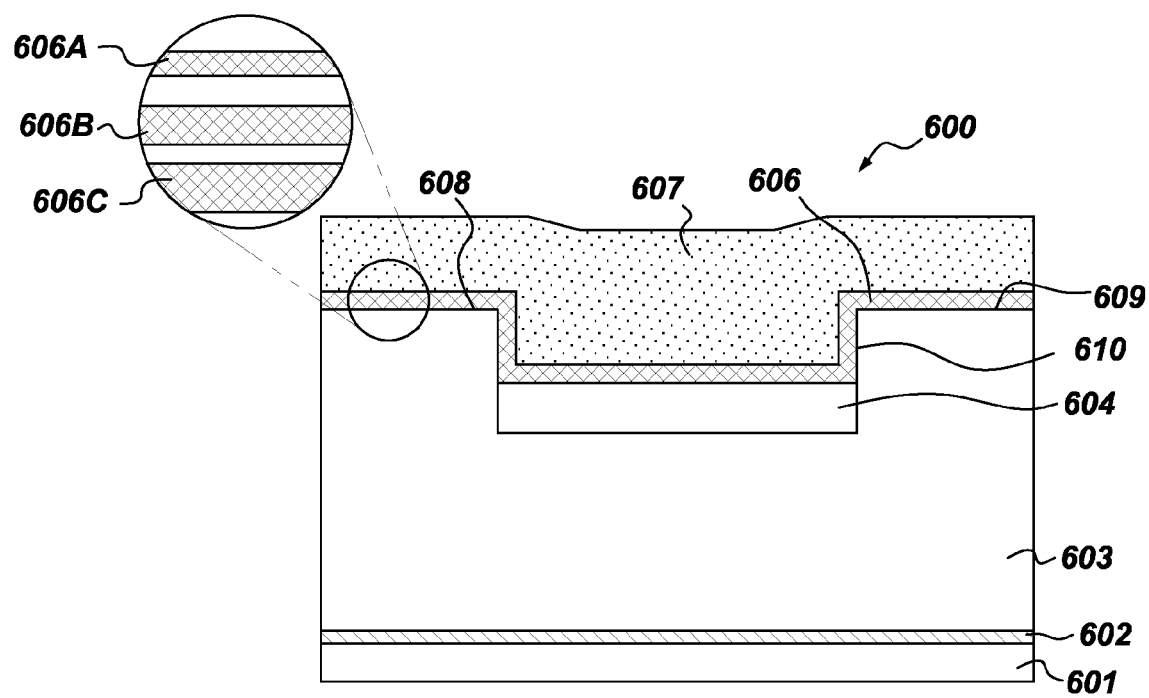
FIG. 6D is a cross sectional view of the device shown in FIG. 6B, wherein the feature comprises multiple layers further comprising different thicknesses and/or concentrations of the detectable element, e.g., C13.

FIG. 6D shows an additional embodiment wherein P-channel 606 may comprise multiple layers, 606A, 606B and 606C, of different thickness and/or concentrations of C13. In this embodiment, layers 606A, 606B and 606C may act as a 'key' and be used to determine gross polish error or to establish polishing rates and/or uniformity across one or more dummy wafers and the parameters determined utilized for runs with live wafers.

Figure 7A:
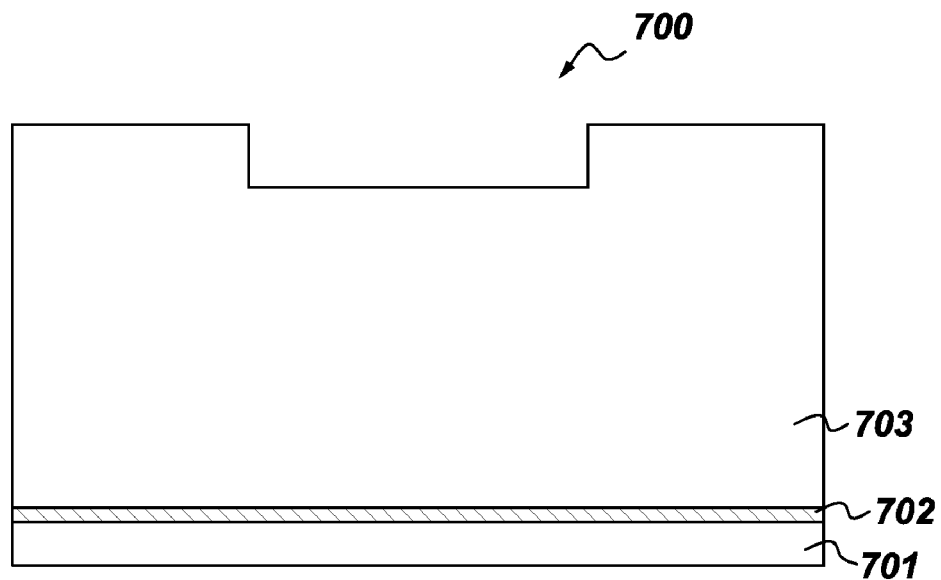
FIG. 7A is a cross sectional view of an in-process semiconductor device according to one embodiment of the invention.
Figure 7B:
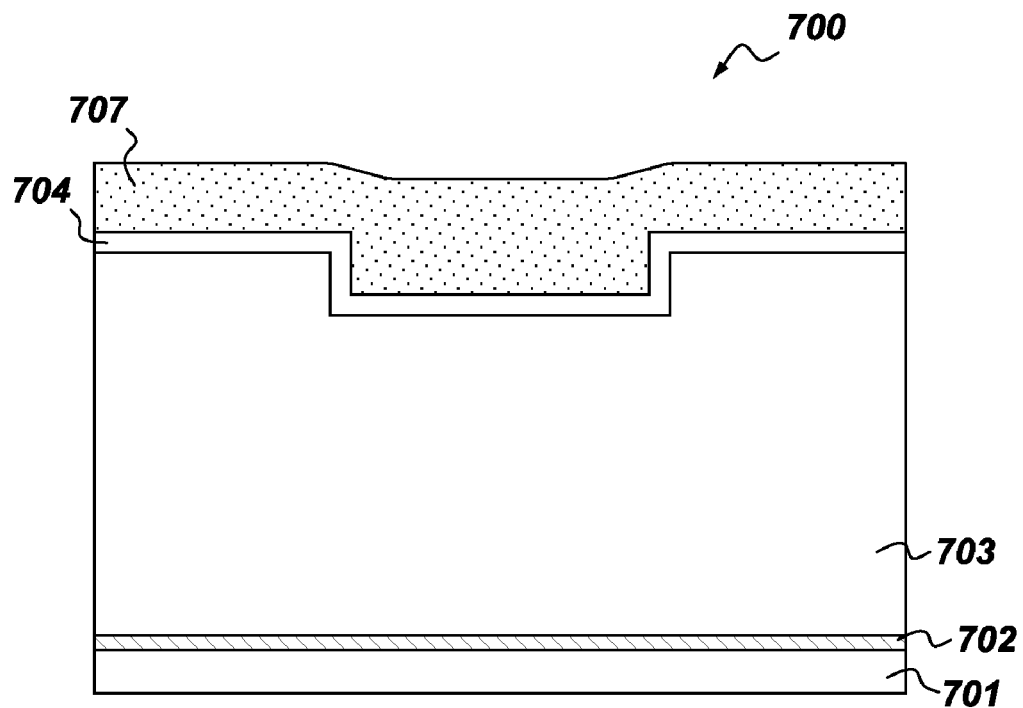
FIG. 7B is a cross sectional view of a semiconductor device incorporating a feature comprising a detectable element according to one embodiment of the invention.

Reference to FIGS. 7A-7E may also be made to further understand the principles of the present method. In FIG. 7A, there is shown an in-process semiconductor device. At this point in processing, device 700 includes N+ substrate 701, N+ buffer 702 and N-drift layer 703. In FIG. 7B, P-well 704 comprising C13 has been deposited overlying N-drift layer 703, and N+ contact layer 707 deposited over P-well 704.

P-well 704 may advantageously be formed via epitaxial growth, with a C13 source substituted for the C12 source that may otherwise be used in order to incorporate C13 into this feature. In alternative embodiments, isotopes of aluminum, gallium, or boron could be utilized, if desired, without substantially detrimentally impacting the overall properties of device 700, once finished.

Figure 7C:
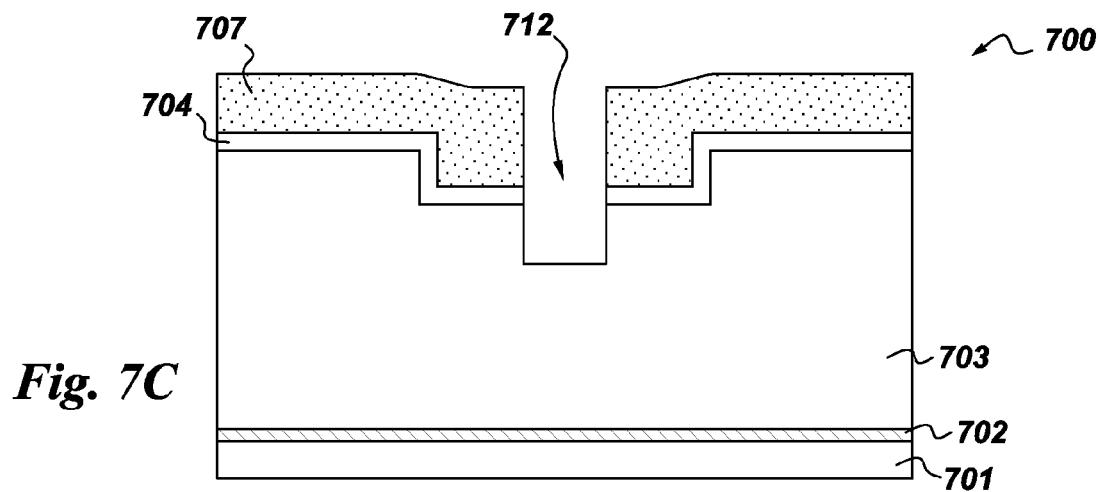
FIG. 7C is a cross sectional view of the device shown in FIG. 7B after an etch step.
Figure 7D:
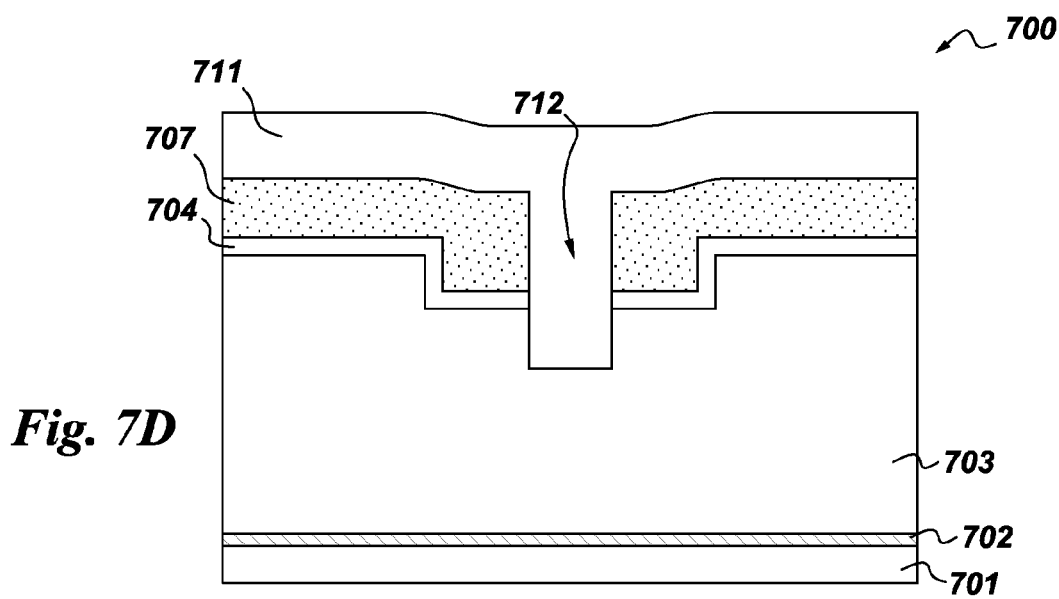
FIG. 7D is a cross sectional view of the device shown in FIG. 7C, after deposition of an additional layer.
Figure 7E:
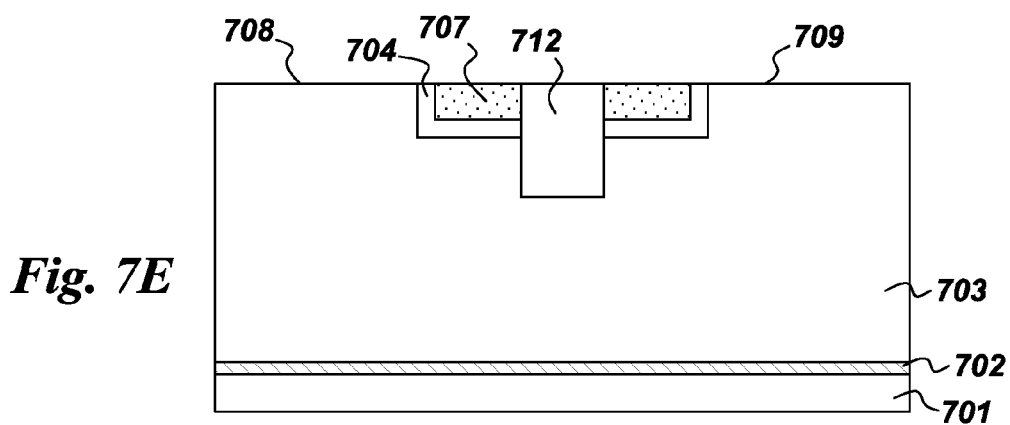
FIG. 7E is a cross sectional view of the device shown in FIG. 7D after utilizing detection of the detectable element, e.g., C13, in the feature for dimension profiling, and applying the information obtained to conduct CMP on the device.

FIG. 7C shows device 700 after an etching step to form trench 712 and FIG. 7D shows device 700 after a second SiC epitaxy to form P+ layer 711 in which the C13 source used in the epitaxial growth of the previous layer, P-well 710, is replaced with a C12 source. The device 700 is then subjected to CMP polishing so that layers 707, 710 and 712 are substantially planar with surfaces 708 and 709 of N-drift layer 703, as shown in FIG. 7E.

Figure 8:
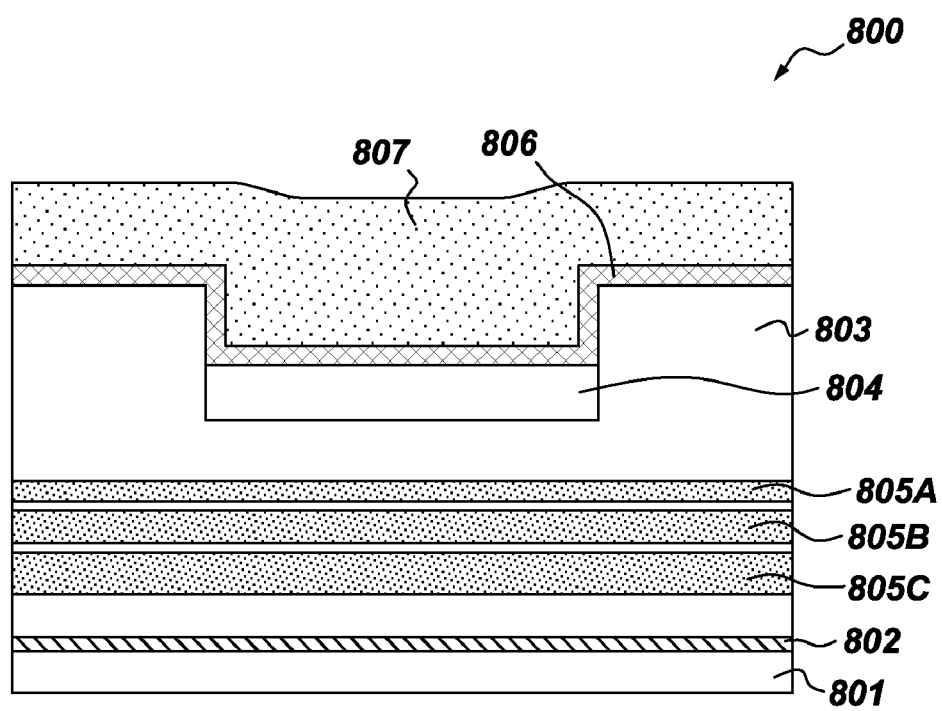
FIG. 8 is a cross sectional view of a semiconductor device in accordance with a further embodiment wherein the feature comprises multiple layers of differing thicknesses and/or concentrations of the detectable element.
Figure 9:
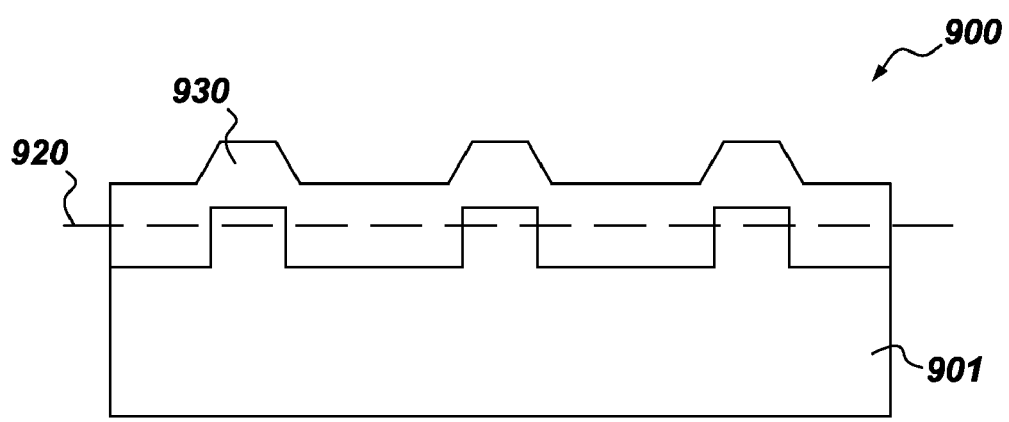
FIG. 9 is a cross sectional view of an alternative semiconductor device that may advantageously be processed according to the present methods.

FIG. 8 shows device 800 according to yet another embodiment of the invention, wherein multiple layers, 805A, 805B and 805C of differing thicknesses or concentration of the detectable element, e.g., C13 are incorporated within N-drift layer 803. In such embodiments, the multiple regions of differing thicknesses and/or concentrations of the detectable element can act as a key so that the total depth with respect to the surface(s) 808 and/or 809 can be calculated. In these embodiments of the invention, it may be desirable to utilize an isotope of the same polarity as the N-drift region, i.e., for typical vertical MOSFETS, it may be desirable to utilize isotopes of nitrogen, or for typical lateral MOSFETS, it may be desirable to utilize isotopes of aluminum. In alternate embodiments, layers 805A, 805B and 805C may comprise C12, and N-drift layer 803 may comprise C13. Another example of a device advantageously processed according to the method of the present invention is shown in FIG. 9. More particularly, FIG. 9 shows a diode structure 900 comprising region 930 overlying N-drift region 901. Either region 930 or N-drift region 901 may comprise the detectable element, and in those embodiments of the invention wherein N-drift region 901 comprises the detectable element, the overall depth, at its largest point measured, and CMP conducted until CMP polish line 920. Alternatively, region 930 may comprise the detectable element, in which case, CMP may be conducted until C13 is no longer detected, or the depth of region 902 estimated and CMP conducted until CMP polish line 920 has been reached.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for dimension profiling of a semiconductor device based upon a silicon carbide substrate comprising:
    incorporating at least one feature comprising a detectable element into the silicon carbide based device;
    measuring at least one dimension of the feature; wherein the detectable element comprises an isotope; and
    wherein the dimension profiling is utilized in the detection of the width, depth and/or thickness and the feature comprises a buried channel.

2. The method of claim 1, wherein the measured dimension comprises depth, the dimension profiling is utilized in the in-line endpoint detection of a CMP process and the method further comprises:
    determining a processing time based at least upon the measured depth of the feature; and
    conducting the CMP process for the determined time.

3. The method of claim 2, wherein the determination of processing time is further based upon an estimated etch rate.

4. The method of claim 1, wherein the detectable element comprises an isotope of aluminum, nitrogen, boron, phosphorus, gallium, oxygen, vanadium, titanium, germanium, silicon, carbon or combinations of these.

5. The method of claim 1, wherein the detectable element comprises an isotope of an element otherwise present in the device.

6. The method of claim 5, wherein the detectable element comprises an isotope of carbon.

7. The method of claim 6, wherein the isotope comprises carbon 12, carbon 13, carbon 14 or combinations of these.

8. The method of claim 1, wherein the dimension of the feature is measured via a substantially nondestructive measurement technique.

9. The method of claim 1, wherein the dimension of the feature is measured via secondary ion mass spectrometry, Rutherford backscattering (RBS), Nuclear reaction profiling (NRP), medium ion energy profiling or combinations of these.

10. The method of claim 9, wherein the dimension of the feature is measured via secondary ion mass spectrometry.

11. The method of claim 1, wherein the feature comprises one or more layers.

12. The method of claim 11, wherein the feature comprises at least two layers and that at least two layers comprise differing thicknesses, differing concentrations of the detectable element, or both.

13. The method of claim 7, wherein the isotope comprises carbon 13.

14. The method of claim 13, wherein carbon 13 is incorporated into at least one of a P-channel, an N-layer, or a buried channel.

15. The method of claim 2, wherein the CMP process is a batch process, the device is a test device and the dimension profiling thereof is utilized in quality control of the batch process.

16. The method of claim 1, wherein the at least one feature is incorporated into the device by epitaxial growth or ion implantation.

* * * * *